(12) United States Patent
Vo

(10) Patent No.: US 6,617,524 B2
(45) Date of Patent: Sep. 9, 2003

(54) PACKAGED INTEGRATED CIRCUIT AND METHOD THEREFOR

(75) Inventor: Nhat D. Vo, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/013,401

(22) Filed: Dec. 11, 2001

(65) Prior Publication Data

US 2003/0106707 A1 Jun. 12, 2003

(51) Int. Cl.[7] ................................................. H05K 1/00
(52) U.S. Cl. ..................... 174/260; 174/261; 174/52.2; 361/760; 361/777; 361/783; 257/787
(58) Field of Search ................................ 174/250, 260, 174/52.2, 52.4; 361/760, 767, 776, 783, 777; 257/787, 784, 788, 789, 791, 792, 793, 795, 779; 29/841, 848, 855

(56) References Cited

U.S. PATENT DOCUMENTS 5,460,767 A * 10/1995 Sanftleben et al. ......... 156/155
5,737,191 A * 4/1998 Horiuchi et al. ............ 174/251
5,859,475 A * 1/1999 Freyman et al. ............ 257/688
5,907,190 A * 5/1999 Ishikawa et al. ............ 257/787
6,365,979 B1 * 4/2002 Miyajima .................... 257/693

FOREIGN PATENT DOCUMENTS

| JP | 4018399 A | 1/1992 |
| JP | 05315393 | 11/1993 |

* cited by examiner

Primary Examiner—David L. Talbott
Assistant Examiner—I B Patel
(74) Attorney, Agent, or Firm—Kim-Marie Vo; James L. Clingan, Jr.

(57) ABSTRACT

To mitigate mold encapsulant bleeding and solder mask cracking in plastic semiconductor packages, a damming structure constructed from metal traces is formed in-line with the encapsulant perimeter. In one embodiment, each damming trace is connected to only one electrical trace, which includes a bonding connection, a signal portion and a plating portion. The damming traces can consist of one trace that is wider than any of the signal traces or multiple rows of traces, for example. The result is a reduction in mold encapsulant bleeding and, thus, an eradication of the processes performed to clean the bleeding.

25 Claims, 2 Drawing Sheets

PACKAGED INTEGRATED CIRCUIT AND METHOD THEREFOR

FIELD OF THE INVENTION

This relates to packaged semiconductors and more particularly to packaged integrated circuits with encapsulants.

BACKGROUND OF THE INVENTION

When packaging integrated circuits in a plastic ball grid array (PBGA) a mold filling process is typically performed to encapsulate the integrated circuit in order to protect the device from environmental damage. To perform the encapsulation, a cavity is placed over a semiconductor die, which is over a packaging substrate, and an encapsulant material is flowed over the semiconductor die and under the cavity. However, this process often results in the encapsulant flowing outside the area under the cavity (bleeding) due to a gap between the package substrate and the bottom edge of the cavity caused by the presence of traces (metal lines) on the package substrate. This bleeding decreases the quality of the resulting package and can potentially be a reliability issue for the package and the encapsulation equipment. In addition, the bleeding is aesthetically undesirable. Thus, additional subsequent cleaning process steps to remove the bleeded material from the package substrate and the encapsulation equipment are performed.

One way to mitigate bleeding is to apply a large pressure to the top and bottom surfaces of the semiconductor package so that the size of the gap between the package substrate and the cavity is minimized. This large pressure results in cracking of the solder resist, which is a protective layer formed over the integrated circuit and traces. Solder resist cracking can result in decreased reliability of the device by making the package substrate prone to corrosion, for example.

In order to decrease solder resist cracking and allow for a large pressure to be applied during encapsulant formation, dummy traces 10 have been formed on a package substrate 5, as shown in FIG. 1. Bond pads 30 on an integrated circuit 20 are connected to electrical traces 50 by wire bonds 40 and bond fingers 45. The electrical traces 50 include a bond connection 12, a signal portion 15 and a plating portion 17. The dummy traces 10 are orthogonal to an edge of the package substrate 5 and/or parallel to the plating portion 17. The dummy traces 10 are not electrically connected to the integrated circuit 20. One problem with using dummy traces 10 is that they are not sufficient for preventing fine filler encapsulant material from bleeding, which is being used as the industry moves to fine pitch wire bonding, meaning the distance between the bond pads 30 is decreased to less than approximately 60 microns. For fine pitch wire bonding, smaller filler is needed in the encapsulant material to reduce wire sweep. (Wire sweep is the touching or shorting of adjacent wires.) Gaps between the encapsulant dummy traces 10 are not sufficient for blocking particles, especially those used in fine filler encapsulant materials. Therefore, a need exists in order to prevent bleeding when using fine filler material for fine pitch packages.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

To mitigate mold encapsulant bleeding and solder mask cracking in plastic semiconductor packages, damming traces are formed between adjacent pairs of electrical traces. Generally, the damming traces are a plurality of damming traces corresponding to adjacent pairs of electrical traces. The damming traces are substantially parallel to the closest portion of the package's encapsulant perimeter. Often, the damming traces are also perpendicular to a main (the largest portion of) the electrical traces. The damming traces may be part of, connected to, electrically isolated from, or not in contact with the electrical traces. Additionally, the damming traces may be a single row of traces, an interdigitated layout, multiple rows of substantially parallel traces, the like, or combinations of the above.

Figure 1:
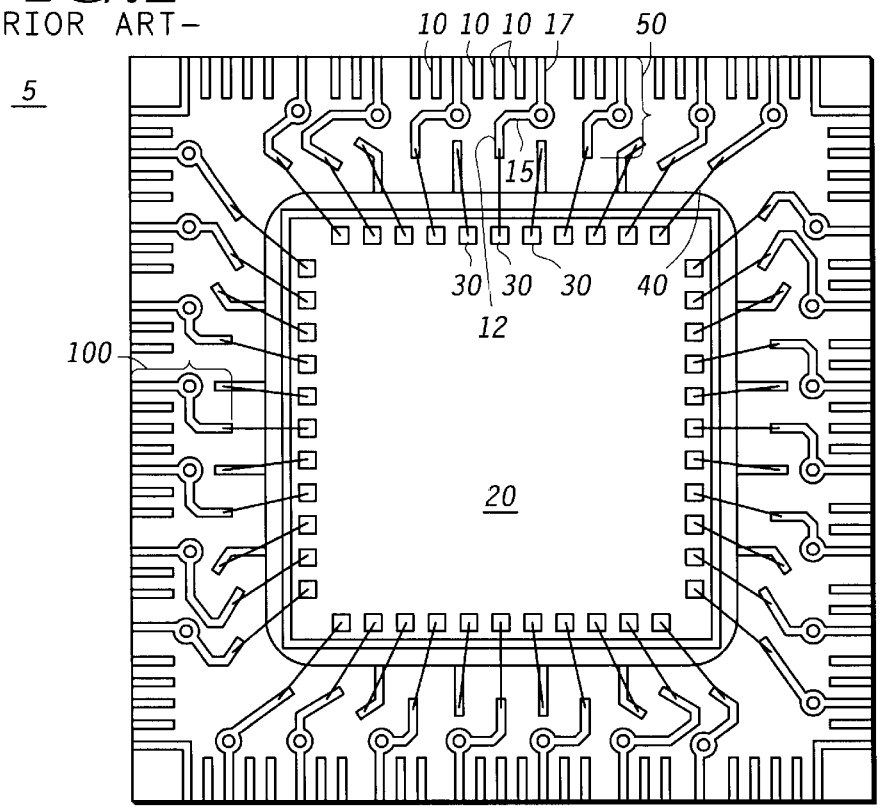
FIG. 1 illustrates a top view of a prior art BGA package using dummy traces.
Figure 2:
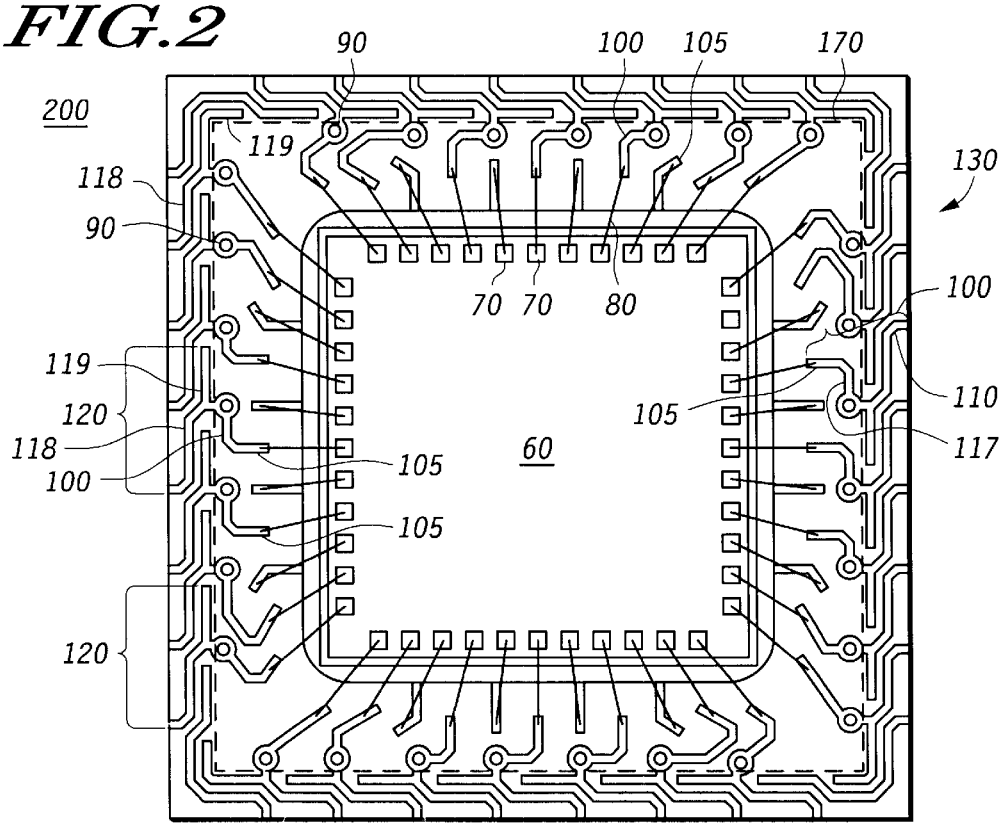
FIG. 2 illustrates a top view of a package in accordance with one embodiment of the present invention.

FIG. 2 shows a top view of a PBGA including the top surface of an integrated circuit or semiconductor die 60 mounted on the top surface of a package substrate 130. The integrated circuit 60 contains bond pads 70 which are electrically connected to bond connections 105 by wire bonds 80. As shown in FIG. 2, the bond connections 105 are bond fingers, meaning they are portions of a trace to which a wirebond is connected. However, if the integrated circuit 60 is not to be wirebonded to the package substrate 130 and instead, for example, the integrated circuit 60 will be packaged using a flip chip process, the bond connections 105 can be bond pads. Alternatively, any other type of bond connection 105 can be used.

The bond connections 105 can be connected to electrical traces 100 and, in the embodiment where the bond connections 105 are bond fingers, the bond fingers can be a portion of the electrical traces 100, as illustrated. Electrical traces 100 include a signal portion or trace 117, which transmit any signal, such as power and voltage supplies, through vias 90, which after subsequent processing, are in contact with solder balls underneath the package. The solder balls transmit the signal from the integrated circuit die 60 outside of the package. It is possible for the electrical traces 100 to only be a signal portion or trace or the electrical traces 100 may include other portions or traces.

The electrical traces 100 may also include plating portions 110, which serve as the cathode for subsequent plating of all the traces on the package substrate. For example, all the traces of the packaged integrated circuit 200 can be copper and plated with a layer of nickel and a layer of gold either by electroless or electrolytic plating. Like the bond connections 105, the plating portions 110 can be portions of the electrical traces 100, as shown. If an electrolytic plating process is used to plate the traces, the plating portions 110 of the electrical traces 100 should terminate at the edge of a package substrate 130, as shown. Instead, if an electroless plating process is used, the electrical traces 100 may not terminate at the edge of the package substrate 130, because a plating portion is not required for the electroless plating process.

Between the electrical traces 100 are the damming traces or barrier traces 120. The damming traces 120 can be a part of the electrical traces 100 or an isolated or separate trace. In the embodiment shown in FIG. 2, the electrical traces 100 have signal portions 117, plating portions 110, bond connections 105 and damming plating portions 118. Also, a separate barrier portion 119 is connected to the electrical trace 100. The damming plating portions 118 and the separate barrier portion 119 form the barrier trace 120. In FIG. 2, each barrier trace 120 is connected to one electrical trace 100 and is not connected to other electrical traces 100. In an embodiment to be discussed below, the barrier traces 120 do not intersect or electrically connect to any electrical trace 100. In some embodiments, it may be useful or desirable to have the barrier traces 120 connected to multiple electrical traces 100 in the event that the electrical traces are for common power or ground. However, the barrier traces 120 will not be electrically connected to all the electrical traces 100.

In the embodiment shown in FIG. 2, the damming traces 120 form a substantially "S" shaped structure that overlap to form rows but are not connected to each other. Substantially "S" shaped means that at least one portion of the traces have an angle that is less than 180 degrees or is curved. In one embodiment, the damming traces 120 are spaced apart from an electrical trace 100 at a closest point from each other no greater than 50 microns or, more preferably, no greater than 25 microns. The substantially "S" shaped damming traces 120 include the damming plating portion 118 and the separate barrier portion 119, which are both adjacent and substantially parallel to each other.

As shown in FIG. 2, the barrier traces 120 are between immediately adjacent electrical traces 100, because no other electrical traces 100 lie between those with which the barrier traces 120 lie between. However, it is possible that the electrical traces 100 are staggered so that the barrier traces 120 are not between immediately adjacent electrical traces 100. Instead the barrier traces 120 are between adjacent electrical traces 100. As used herein, "adjacent" refers to two structures that are next to each other but can have structures between them, and "immediately adjacent" refers to two structures that are next to each other and do not have any structures between them.

In the embodiment shown in FIG. 2, all of the barrier traces 120 terminate with plating portions 110. However, this is not necessary. For example, the damming traces can terminate at the via 90 or at the electrical trace 100 with the via 90 which includes a plating portion 110 on another layer of the substrate. Another example of when damming traces 120 do not terminate with plating portions 110 is when electroless plating is used. The main purpose of the damming traces 120 is to hinder or prevent the mold encapsulant, especially encapsulants used for covering and protecting integrated circuits with fine pitch wire bonding, from flowing outside a cavity placed on the package substrate during the encapsulant process. Generally, fine pitch wire bonding means the bond pads 70 are less than 60 microns away from each other. The particles in the encapsulant, generally, have filler particles on the order of 20 microns in diameter. In the embodiment shown in FIG. 2, the damming traces are curved to assist in hindering the flow of the encapsulant material. Additionally, the presence of traces in multiple rows also helps to hinder the encapsulant flow.

The damming traces 120 can be manufactured when the electrical traces 100 are formed. Typically, these steps are performed during the manufacturing of the package substrate 130. A metal layer is deposited and patterned using conventional processes. Therefore, to add the damming traces 120 to a package substrate the metal pattern etched on the package substrate 130 would not require a change in the process chemistry or sequence. Instead, the (mask) pattern would be altered to the desired configuration.

Figure 3:
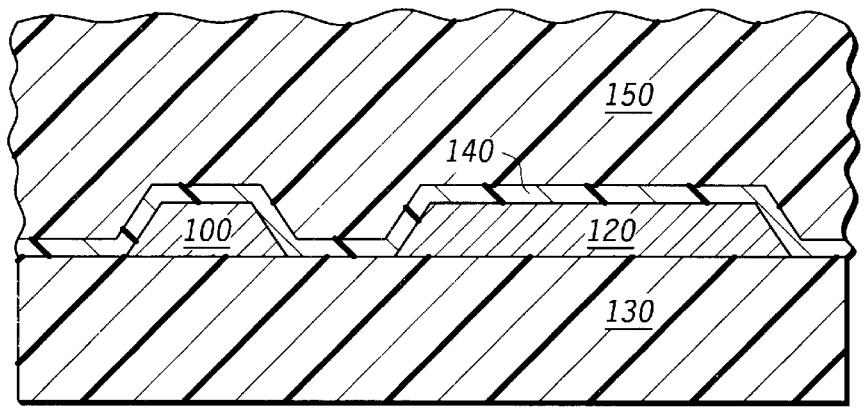
FIG. 3 illustrates a cross-sectional view of FIG. 2.

After the integrated circuit 60 is wire bonded to the bond connections 105, a solder resist layer 140 is deposited over a top surface of the package substrate 130, the electrical traces 100 and barrier traces 120 using any desired deposition method. Next, the mold encapsulation process is performed. FIG. 3 illustrates a portion of the packaged integrated circuit 200 in cross-sectional view after mold encapsulation. For the mold encapsulation process, the cavity is placed on the packaged integrated substrate 130 and terminates either adjacent to or over a portion of the barrier trace 120. In a preferred embodiment, the cavity is placed on or abutting the innermost edge of the damming trace line 120. The cavity is then filled with the mold encapsulant and is later removed after subsequent heat processes resulting in the encapsulant 150 being formed over the package substrate 130 and integrated circuit 60. The perimeter (outer edges) of the encapsulant is shown in FIG. 2 as line 170.

As seen in FIG. 2, at least a portion of the damming traces 120 lie outside the encapsulant and are substantially parallel to the closest portion of the encapsulant perimeter 170. In one embodiment, a large portion (more than 50%) of each damming trace 120 lies outside the encapsulant perimeter 170, and a small part (less than 50%) of each damming trace 120 lies inside the encapsulant. It is not important, though, that all or at least a portion of the damming traces 120 lie outside the encapsulant perimeter 170. Instead, the damming traces 120 or a portion of them can be aligned with the perimeter of the encapsulant. In other words, a portion of the damming traces 120 is a distance away from the closest edge of the substrate that is less than or equal to a distance between the perimeter of the encapsulant and a closest edge of the substrate. A portion of the damming traces 120 is no farther away from the edge of the substrate than the perimeter of the encapsulant.

In the embodiments where the damming traces 120 have multiple parallel rows of damming traces 120, the inner rows may be the only rows substantially contiguous with the perimeter of the encapsulant because their presence will hinder or prevent the encapsulant from passing them. Alternatively, the inner rows can be within the desired mold encapsulant and the outer rows can be within, outside or contiguous with the perimeter of the encapsulant. Thus, not much encapsulant, if any, travels pass the damming traces 120 and a portion of the damming traces 120 will probably be substantially contiguous with or aligned to the perimeter of the encapsulant.

After forming the encapsulant as described, additional conventional processing is performed in order to attach the solder balls to the package substrate 130. The resulting completed packaged integrated circuit can be mounted to a printed circuit board to perform a desired function.

Figure 4:
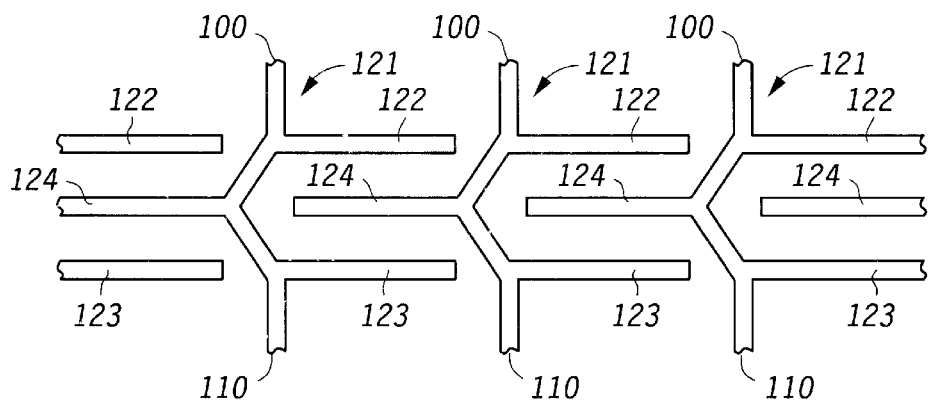
FIGS. 4 and 5 illustrate top views of alternate embodiments of the present invention.

FIG. 4 shows an alternate embodiment of damming traces 120. Damming traces 121 are interdigitated and substantially "Y" shaped. The damming traces 121 have an inner trace 122, an outer trace 123 and a middle trace 124 that is closer to the semiconductor die 60 than the outer line 123, but farther from the semiconductor die 60 than the inner trace 122. Additionally, the middle trace 124 is located adjacent to and between the inner trace 122 and outer trace 123. The inner trace 122, outer trace 123, and middle trace 124 can be electrically connected by a common electrical trace 100. The inner trace 122, the outer trace 123 and the middle trace 124, all are substantially parallel to the edge 170 of the encapsulant 150. The inner trace 122 and the middle trace 124 are substantially parallel to each other and, in one embodiment, are spaced apart no more than 50 microns, or more preferably, 25 microns. In this embodiment, the middle trace 124 is adjacent and substantially parallel to the inner trace 122. Additionally, in one embodiment, the middle trace 124 and the outer trace 123 are substantially parallel to each other and are spaced apart no more than 50 microns, or more preferably, 25 microns. In this embodiment, the middle trace 124 is adjacent and substantially parallel to the outer trace 123.

In the embodiment shown in FIG. 4, each damming trace 121 is electrically connected to one electrical trace 100 and each terminates with a plating portion 110. Each damming trace 121 is not electrically connected to more than one electrical trace 100 in the embodiment shown. Again, in some circumstances each damming trace 121 may be connected to more than one electrical trace 100 and each damming trace 121 may not terminate in a plating portion 110.

Figure 5:
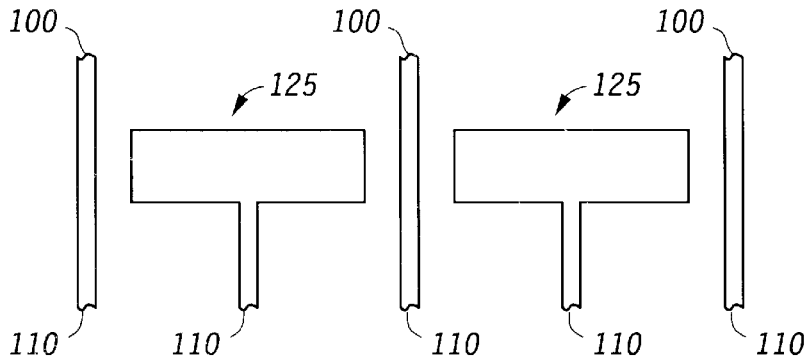

FIG. 5 illustrates another embodiment of the present invention. Damming traces 125 shown in FIG. 5 can be substituted for the damming traces 120 in FIG. 2. The damming traces 125 are rectangular traces that are not electrically connected to any electrical trace 100 but are connected to plating traces 110. The damming traces 125 can be one rectangle that is thinner than, equal to, or substantially wider than the electrical traces 100 on the package substrate 130. Alternatively, the damming traces 125 can be two parallel thinner rectangular traces. In the embodiment where the damming traces 125 are substantially wider than the electrical trace 100, the damming traces 125 are at least three times the width of the electrical traces 100. In another embodiment, the damming traces 125 may be connected to at least one electrical trace 100 and may be connected to at least one electrical trace 100 at the plating portion 110, if present.

The presence of the damming traces 120, 121 and 125 as previously discussed aids in the hindrance or prevention of the encapsulant bleeding, be blocking the area available for the encapsulant to leave the cavity. Since the space available for the encapsulant to leave the cavity is decreased, finer particles are less likely to bleed. Thus, the damming traces 120, 121 and 125 enable the use of encapsulants with fine fillers, unlike the prior art.

Bleeding is a quality issue and should be avoided. In addition, reduced bleeding decreases the maintenance frequency to remove shards of bleed from the mold to avoid damage to the wire bond and the integrated circuit, which could lead to reliability issues.

Another advantage of the damming traces 120, 121, and 125 is that solder resist cracks decrease and, thus, the reliability and yield of the packages increases. Additionally, the damming traces 120, 121 and 125 enable the force that is applied during the process of flowing the mold encapsulant to be increased. As previously discussed, the solder resist cracks result from the pressure used to decrease the gap between the cavity and the package interconnect circuit 200. However, the presence of damming traces 120, 121 and 125 forms a more planar surface of the packaged integrated circuit 200 than any of the prior art methods. This increased planarity is believed to decrease the number of solder resist cracks even when a larger force is applied to the package interconnect circuit 200 during encapsulant filling. A higher forced used during a mold encapsulant process is desirable in order to decrease the gap between the package substrate 130 and the cavity. The smaller this gap, the less bleeding will occur. Therefore, the presence of the damming traces 120, 121 and 125 at least hinder bleeding, especially when using fine filler material for fine pitch packages.

Although as shown in the figures, the barrier traces are on the same side of the package substrate 130 as the encapsulant, the barrier traces can be formed on the opposite side or on any metal layer within the package substrate 130. In this embodiment, the barrier traces are aligned near the perimeter of the encapsulant. For example, they can be aligned outside, contiguous with, or inside the perimeter. The barrier layer will provide for an increased uniform thickness of the substrate. This improved uniformity helps to reduce the gap between the substrate and the mold cavity during encapsulation, thereby further decreasing bleed. A skilled artisan should recognize that the barrier traces can be on the same side of the package substrate as the encapsulant, the opposite side of the package substrate as the encapsulant, on a metal layer within the package substrate or combinations of the above. The presence of barrier traces on either side of the package substrate, on the metal layers within the package substrate or combinations of the above depends on the topography of the package substrate. For example, if a metal layer is present on the top side of the package substrate, barrier layers may be desired on the top side. If metal layers, such as metal used for attaching solder balls, are on the bottom side of the package substrate, barrier layers may be desired on the bottom side. And if metal layers are on both sides, then barrier layers may be desired on both sides. Alternatively, if it provides for increased uniformity the barrier traces can be on the metal layers within the package substrate.

Although the invention above was described in regards to BGA's, the presence of damming traces 120 is beneficial for any package that forms an encapsulant by flowing, such as flip chip and leaded package as well. A leaded package using leads instead of solder balls for the signal to travel from the packaged integrated circuit to the printed circuit board. Additionally, the figures show encapsulation of the integrated circuit 60 on a singulated package substrate 130, however, the barrier traces can be used in a process where the package substrate 130 has multiple integrated circuits 60 on its top surface during encapsulation, as is done in a MAP (mold array package) process.

In the foregoing specification, the invention has been described with reference to specific embodiments. However, one of ordinary skill in the art appreciates that various modifications and changes can be made without departing from the scope of the present invention as set forth in the claims below. For example, other designs for the damming traces than those shown or described in regards to FIGS. 2, 4 and 5 may be used, such as the damming traces 120, 121 or 125, can be orthogonal to the electrical traces 100. Additionally, the number of damming traces used can be altered. Less than or more than those shown or described can be implemented in a design. Furthermore, the barrier traces can be any shapes including regular or irregular shapes not described. For example, the barrier traces could be peanut-shaped, triangular, concave moon shaped or the like. In addition, the solder resist can be present between the barrier traces and the encapsulant. Therefore, if the encapsulant is contiguous with the barrier trace, it is possible that the solder resist is between the encapsulant and the barrier trace. Accordingly, the specification and figures are to be regarded in an illustrative rather than a restrictive sense, and all such modifications are intended to be included within the scope of the present invention.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A packaged integrated circuit comprising:
    a substrate having a top surface and an edge;
    an integrated circuit die mounted on the substrate;
    an encapsulant over the top surface of the substrate, wherein the encapsulant has a perimeter, wherein a first portion of the perimeter is a first distance away from the edge of the substrate;
    a first barrier trace on the top surface, closest to the first portion of the perimeter of the encapsulant, and substantially parallel to the first portion of the perimeter of the encapsulant, wherein a portion of the first barrier trace is a second distance away from the edge of the substrate and the second distance is less than or equal to the first distance;
    a first bond connection on the top surface and inside the perimeter;
    a second bond connection on the top surface and inside the perimeter;
    a first electrical trace on the substrate and electrically connected to the first bond connection; and
    a second electrical trace adjacent to the first electrical trace and electrically connected to the second bond, wherein a portion of the first barrier trace is between the first and second electrical traces.

2. The packaged integrated circuit of claim 1, wherein the first barrier trace is outside the perimeter of the encapsulant.

3. The packaged integrated circuit of claim 1, wherein a portion of the first barrier trace is aligned with the perimeter of the encapsulant.

4. The packaged integrated circuit of claim 1, wherein the first barrier trace is connected to the first electrical trace.

5. The packaged integrated circuit of claim 4, further comprising:
    a third bond connection on the top surface of the substrate and inside the perimeter;
    a third electrical trace adjacent to the second electrical trace, on the substrate, and electrically connected to the third bond connection; and
    a second barrier trace on the top surface, wherein a portion of the second barrier trace is a third distance away from the edge of the substrate, the third distance is not greater than the first distance, and the second barrier trace is between the second and third electrical traces and substantially parallel the first portion of the perimeter.

6. The packaged integrated circuit of claim 5, wherein the second barrier trace is connected to the second electrical trace.

7. The packaged integrated circuit of claim 6, wherein the first, second, and third electrical traces and the first and second barrier traces are covered with solder resist.

8. The packaged integrated circuit of claim 7, wherein the first barrier trace is spaced from the second electrical trace at a closest point by no more than 50 microns.

9. The packaged integrated circuit of claim 4, further comprising a second barrier trace connected to the second electrical trace, wherein the second barrier trace is adjacent to the first barrier trace on a first side of the first barrier trace and substantially parallel to the first barrier trace.

10. The packaged integrated circuit of claim 9, further comprising a third barrier trace connected to the first electrical trace that is adjacent to the second barrier trace and substantially parallel to the second barrier trace.

11. The packaged integrated circuit of claim 1, wherein the second electrical trace has a portion that is adjacent to the first barrier trace, substantially parallel to the first barrier trace.

12. The packaged integrated circuit of claim 1, further comprising a second barrier trace parallel to and adjacent to the first barrier trace.

13. The packaged integrated circuit of claim 12, wherein the first barrier trace is spaced from the second electrical trace at a closest point by no more than 50 microns.

14. The packaged integrated circuit of claim 13, wherein the first barrier trace is spaced from the first electrical trace at a closest point by no more than 50 microns.

15. The packaged integrated circuit of claim 1, wherein:
    the first electrical trace further comprises:
        a first signal portion electrically connected to the first bond connection; and
        a first plating portion extending from the first signal portion to the edge of the substrate; and
    the second electrical trace further comprises:
        a second signal portion electrically connected to the second bond connection; and
        a second plating portion extending from the second signal portion to the edge of the substrate.

16. The packaged integrated circuit of claim 1, wherein a third electrical trace is between the first electrical trace and the second electrical trace; and wherein the third electrical trace is a third distance from the edge of the substrate, wherein the third distance is greater than the first distance.

17. A packaged integrated circuit, comprising:
    a substrate having a plurality of bond connections, a plurality of vias, and an edge;
    an integrated circuit die mounted on the substrate and bonded to the plurality of bond connections;
    a plurality of signal traces running from the plurality of bond connections to the plurality of vias;
    an encapsulant over the substrate surrounding the bond connections, over the integrated circuit, and having an encapsulant perimeter; and
    a first plurality of barrier traces no farther from the edge of the substrate than the perimeter of the encapsulant and between adjacent pairs of signal traces, and wherein a portion of the first plurality is substantially parallel to a closest portion of the encapsulant perimeter.

18. The packaged integrated circuit of claim 17, wherein the first plurality of barrier traces are spaced to within no more than 50 microns of at least one of the plurality of signal traces.

19. The packaged integrated circuit of claim 17, wherein each of the plurality of signal traces further comprise a barrier portion, wherein each barrier portion corresponds to one of the barrier traces of the first plurality of barrier traces and each barrier portion is adjacent to and substantially parallel with the barrier trace to which it corresponds.

20. The packaged integrated circuit of claim 17, wherein each barrier trace of the first plurality of barrier traces corresponds to one of the adjacent pairs of signal traces and each barrier trace of the first plurality of barrier traces is between the adjacent pairs of signal traces to which it corresponds.

21. The packaged integrated circuit of claim 20, wherein each barrier trace of the first plurality of barrier traces is connected to one of the plurality of signal traces of the adjacent pairs of signal traces to which it corresponds.

22. The packaged integrated circuit of claim 17, wherein a portion of each barrier trace is outside the encapsulant perimeter.

23. The packaged integrated circuit of claim 17, further comprising a second plurality of barrier traces on the substrate, wherein each barrier trace of the second plurality of barrier traces corresponds to one of the adjacent pair of signal traces, and wherein each barrier trace is between the adjacent pairs of signal traces to which it corresponds.

24. The packaged integrated circuit of claim 23, further comprising a third plurality of barrier traces on the substrate, wherein each barrier trace of the third plurality of barrier traces corresponds to one of the adjacent pair of signal traces, and wherein each barrier trace is between the adjacent pairs of signal traces to which it corresponds.

25. The packaged integrated circuit of claim 17, wherein a first plurality of barrier traces are on the opposite side of the substrate than the encapsulant.

* * * * *

UNITED STATES PATENT AND TRADEMARK OFFICE
CERTIFICATE OF CORRECTION

PATENT NO. : 6,617,524 B2
DATED : September 9, 2003
INVENTOR(S) : Nhat D. Vo

It is certified that error appears in the above-identified patent and that said Letters Patent is hereby corrected as shown below:

Column 8,
Line 39, add -- and wherein the first barrier trace is interdigitated and substantially "Y" sharped -- after "distance;".
Line 67, add -- and wherein the first plurality of barrier traces is interdigitated and substantially "Y" shaped -- after "perimeter".

Signed and Sealed this

Twenty-third Day of November, 2004

JON W. DUDAS
*Director of the United States Patent and Trademark Office*